United States Patent [19]
Alberter et al.

[11] Patent Number: 5,796,232
[45] Date of Patent: Aug. 18, 1998

[54] CIRCUIT CONFIGURATION FOR THE EVALUATION OF SENSOR SIGNALS OF INDUCTIVE SENSORS IN MOTOR VEHICLES

[75] Inventors: Gunther Alberter, Nürnberg; Jörg Baumann, Veitsbronn; Gunther Breu, Nürnberg; Wolfgang Gutbrod, Möhrendorf, all of Germany

[73] Assignee: Temic Telefunken microelectronic GmbH, Heilbronn, Germany

[21] Appl. No.: 609,810

[22] Filed: Mar. 1, 1996

[30] Foreign Application Priority Data

Mar. 7, 1995 [DE] Germany .................. 195 07 897.7

[51] Int. Cl.$^6$ .................................................. G05B 1/06
[52] U.S. Cl. .................................. 318/653; 324/537
[58] Field of Search ........................... 318/254, 138, 318/439, 600, 601, 602, 603, 604, 605, 637, 638, 653, 652, 45, 647, 650, 651, 654, 660, 661, 434; 324/537, 200–243; 307/10.1, 10.2

[56] References Cited

U.S. PATENT DOCUMENTS 4,481,924  11/1984  Kobayashi .
5,291,121  3/1994  Todd et al. .

FOREIGN PATENT DOCUMENTS

| 0288119 | 10/1988 | European Pat. Off. | H03K 5/153 |
| 0303397 | 2/1989 | European Pat. Off. | G01R 19/175 |
| 0366619 | 5/1990 | European Pat. Off. | F01R 19/175 |
| 0366619A1 | 5/1990 | European Pat. Off. | |
| 2235056 | 8/1973 | Germany | G01P 3/48 |
| 3417676 | 11/1985 | Germany | G01R 19/165 |
| 4119108 | 12/1992 | Germany | G01R 29/02 |
| 4131128 | 2/1993 | Germany | G01D 5/244 |

OTHER PUBLICATIONS

Secura, Roger D.: Digital Peak Detector. In: Radio-Electronics, 1989, pp. 59–62.

Patent Abstracts of Japan, vol. 011, No. 367, (E–561), Nov. 28, 1987 & JP–A–62 140511 (Matsushita Electric Ind. Co. Ltd.) 24 Jun., 1987.

Primary Examiner—William M. Shoop, Jr.
Assistant Examiner—Kim Lockett
Attorney, Agent, or Firm—Paul J. Vincent

[57] ABSTRACT

A circuit configuration for the evaluation of inductive sensor signals in motor vehicles is described. An input stage comprising an input circuit and a reference circuit and a threshold value stage comprising a peak value rectifier circuit, converter circuit, comparator circuit, and adjustment circuit are provided for the recognition of the crossover of an alternating voltage sensor signal.

4 Claims, 1 Drawing Sheet

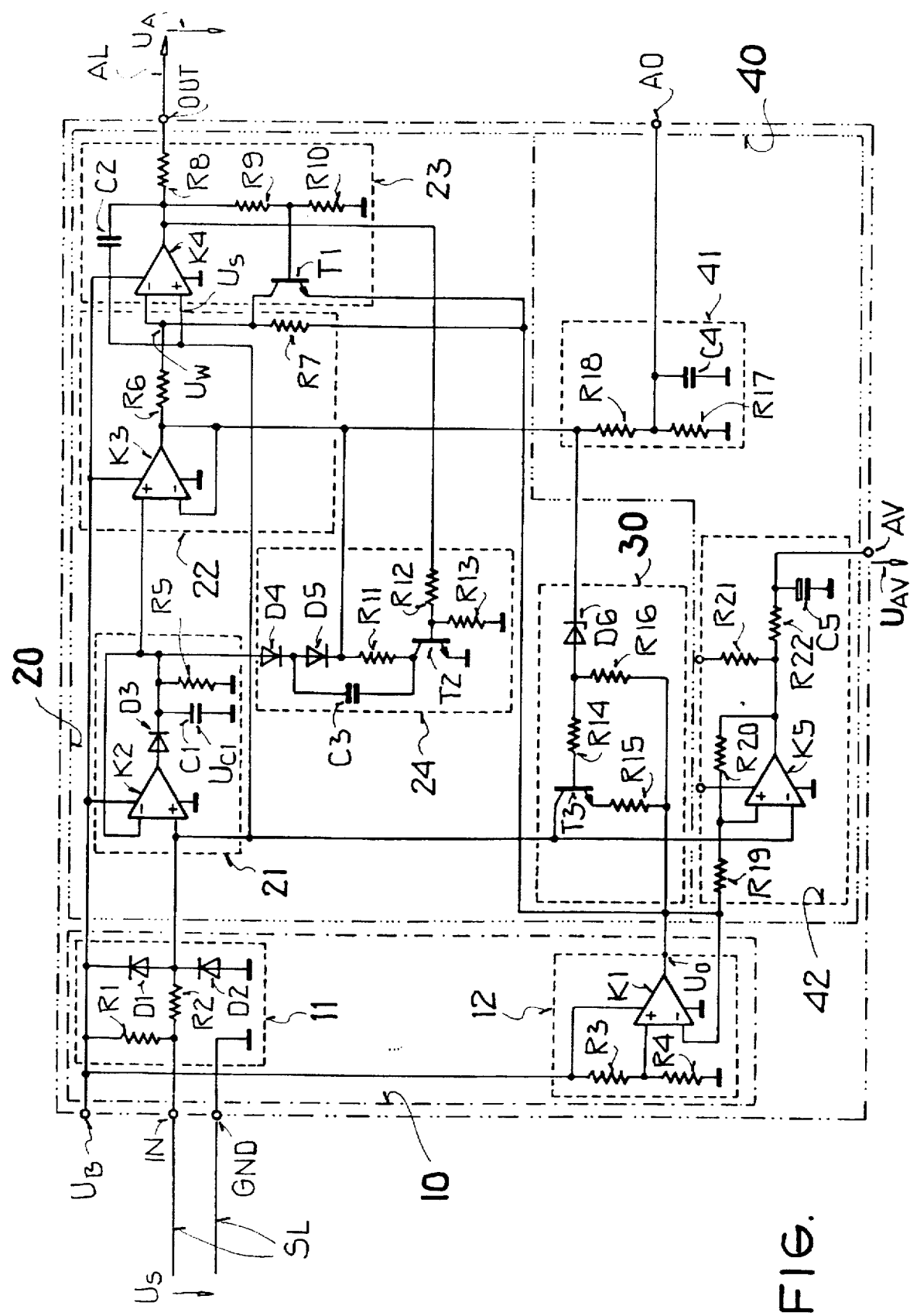
FIG.

CIRCUIT CONFIGURATION FOR THE EVALUATION OF SENSOR SIGNALS OF INDUCTIVE SENSORS IN MOTOR VEHICLES

BACKGROUND OF THE INVENTION

Inductive sensors are utilized for various purposes in motor vehicles to, for example, detect the revolution speed or position of moving components or units of the motor vehicle (motor, transmission, etc.). Inductive sensors generally have a simple construction and comprise a coil arranged upon a soft iron core with permanent magnets and detect motional changes through resulting changes in magnetic flux. Measuring markings introduced on the components or units of the motor vehicle function as signal triggers. For example, teeth, lobes, depressions or bore holes can be provided to trigger signals. The (periodic) change of the magnetic flux causes an induction voltage in the inductive sensor and a measured signal whose (periodic) time dependence can be evaluated. The measured sensor signals are introduced to the motor vehicle control units for control or regulation purposes by means of connecting cables to control, for example, the motor, transmission, for ABS applications, or for fuel injection.

These types of motor vehicle inductive sensors have the shortcoming that the sensor signal depends on the motion of the signal trigger (revolution speed, angular velocity, eccentricity), on the separation between the sensor and the signal trigger, and on the surface characteristics of the signal trigger to sometimes cause strong variations in the amplitude of the sensor signal (useful signal). Furthermore, the sensor signal must be detected over a large voltage range (due to the large angular velocity differences: for example 1–35 V). As a result interfering signals (interfering voltages) can frequently occur and can overlap the sensor signal with amplitudes on the order of those of small useful signals. As a result, the reliability of the sensor signals from the inductive sensor can no longer be guaranteed and further processing of the sensor signals by appropriate motor vehicle control units is not always possible. In particular, for many applications (most importantly for position detection) the sensor signal crossover can often not be precisely detected.

The underlying purpose of the invention is to present a circuit configuration for the evaluation of sensor signals from inductive sensors in motor vehicles by means of which the sensor signal can be reliably processed.

SUMMARY OF THE INVENTION

This purpose is achieved with a-circuit configuration for the evaluation of the sensor signal of inductive sensors in motor vehicles comprising an input stage having an input circuit and a reference circuit as well as a threshold value stage having a peak value rectifying circuit, a converter circuit, a comparator circuit and an adjustment circuit, the input and threshold value stages for recognizing a crossover of an alternating voltage sensor signal.

The (alternating voltage) sensor signals are introduced via sensor cables to the circuit input of the circuit configuration in the form of input signals. The circuit configuration produces therefrom a characteristic output signal in the event of a sensor signal crossover (a change from the positive to the negative wave-half) in dependence on the amplitude of the sensor signal and provides this output signal to downstream motor vehicle control units. This type of circuit configuration to evaluate sensor signals can be provided for every motor vehicle inductive sensor.

The circuit configuration has functional units comprising an input stage with an input circuit and a reference circuit for processing the input signal and for the production of an internal reference potential ("virtual zero") as the basis for the remaining circuit components, in particular, as a reference voltage for the zero level of the sensor signal as well as a threshold value stage for the detection of the crossover of the sensor signal by producing and tracking a peak threshold value ("level tracking") in dependence on the amplitude of the sensor signal. The threshold value stage comprises a peak value rectifier circuit for preparing a peak value as initiating criterion for the recognition of the crossover, an adjustment circuit for adjusting the peak value to the changed signal dependence of the sensor signal to prepare a reference value for the next period of the sensor signal, a converter circuit for converting the peak value, and a comparator circuit for detecting the crossover. The circuit configuration can also include an attenuation stage as a functioning unit for the active attenuation of the sensor signal at high sensor signal amplitudes, in particular, for interfering signals overlapping the sensor signal as well as an error stage for error recognition and circuit diagnostics.

Advantageously, the described circuit configuration:

Achieves a good interfering signal to useful signal ratio in consequence of the level tracking of the sensor signal in dependence on the respective preceding useful signal level and in consequence of active attenuation of interfering signals in the event of high useful signal levels. This reduces susceptibility to sensor signal interferences and increases the reliability of the inductive sensors.

Facilitates diagnostic capability to recognize defects in the sensor cables (open or short circuits) and defects in the inductive sensor (crossed sensor cables, insufficient sensor signal capability due to improper sensor configuration).

The circuit configuration for the evaluation of the sensor signal of an inductive sensor will be more closely described with reference to an embodiment of crankshaft/camshaft sensors associated with diesel injection in a motor vehicle.

BRIEF DESCRIPTION OF THE DRAWING

The FIGURE shows a circuit configuration with its functional units and associated circuit components.

DESCRIPTION OF THE PREFERRED EMBODIMENT

For the fuel injection procedure, the position of the crankshaft and the camshaft must be known (for example to an accuracy of 1°). The motion of a trigger wheel (signal trigger) having 36 bore holes and introduced onto the crankshaft is detected by an inductive sensor located at the motor block to generate an alternating voltage sine signal as sensor signal. The motion of a trigger wheel located on the camshaft and having a through-hole is detected by an inductive sensor at the motor block to generate an alternating voltage sine signal as sensor signal. The crossover of both sensor signals serves as the time reference for the injection time. A circuit configuration is provided for evaluation of each of the two sensor signals which is integrated into a control apparatus for diesel injection. In accordance with the FIGURE, the circuit configuration for the detection of the crossover between the positive and negative wave-halves of the sensor alternating voltage signal (the inductive sensor must have a polarity such that the positive wave-half comes first) consists of an input stage 10, a threshold value stage 20, an attenuation stage 30, and an error stage 40:

Input stage 10

The alternating voltage sensor signal $U_S$ from the inductive sensor is introduced to the input circuit 11 (resistor R1, R2; clamping diodes D1, D2) by means of the two sensor cables SL at the circuit input IN and at the connection for the (external) reference potential GND. The circuit configuration has an operational voltage $U_B$ of, for example, 12 V. The resistor R1 forms a voltage divider together with the inner resistor of the inductive sensor connected at the circuit input IN/GND. This voltage divider is, for example, dimensioned in such a fashion (R1=6.8 K$\Omega$) that the DC voltage present on the sensor assumes a value of 1.9 V (the DC voltage level of the sensor signal). The resistor R2 serves as a current limiter and the diodes D1 and D2 are clamping diodes and limit the voltage.

The reference circuit 12 (voltage divider comprising resistors R3, R4; impedance converter comparator K1) copies the input circuit 11 or its voltage conditions. The reference circuit 12 generates a reference voltage $U_O$ as reference quantity for the crossover of the sensor signal $U_S$ ("virtual zero") in dependence on the voltage conditions of the input circuit 11 which is made available to the remaining functional units or circuit components as an (internal) reference potential (in accordance with the above example, corresponding to $U_O=1.9$ V).

Threshold value stage 20

The peak value rectifier circuit 21 (peak value comparator K2; diode D3; low-pass capacitor C1, resistor R5) detects the peak value (maximum value) $U_{Smax}$ of the sensor signal $U_S$ during the positive wave-half of the sensor signal $U_S$ introduced to the non-inverted input (+) of the peak value comparator K2 and stores same in capacitor C1 as voltage value $U_{C1}$. The low-pass (C1, R5) is dimensioned in such a fashion that its time constant is large compared to the duration of the period of the sensor signal $U_S$, i.e. the peak value $U_{Smax}$ remains stored until the next positive wave-half of the sensor signal $U_S$.

The peak value $U_{Smax}$ of the sensor signal $U_S$ is halved by the converter circuit 22 (impedance comparator K3; voltage divider resistors R6, R7) and the output signal $U_W=\frac{1}{2}\cdot U_{Smax}$ is formed.

The crossover of the sensor signal $U_S$ is detected by the comparator circuit 23 (crossover comparator K4; feedback capacitor C2; output voltage divider resistors R8, R9, R10; switching transistor T1). Towards this end, the sensor signal $U_S$ is introduced to the non-inverted input (+) of the comparator K4. The output signal $U_W$ of the converter circuit 22 ($U_W=\frac{1}{2}\cdot U_{Smax}$) is introduced to the inverted input (-) of the comparator K4 or the reference voltage $U_O$ produced by the reference voltage 12 is introduced to the inverted input (-) of the comparator K4 via the resistor R7 of converter circuit 22 which is in parallel with the switching transistor T1. The output of the comparator K4 is at high level during the voltage rise in the positive wave-half of the sensor signal $U_S$($U_S>U_W$), so that the transistor T1 is switched and the resistor R7 of voltage divider R6, R7 is bypassed to present reference voltage $U_O$ to the inverted input (-) of the comparator K4. The sensor signal $U_S$ goes below the virtual zero $U_O$($U_S<U_O$) during the sensor signal Us "crossover" (transition from positive to negative wave-half) and the output of the comparator K4 goes into the low-level. This high-low switching step at the output of the comparator K4 is transferred to the control device in the form of output signal $U_A$ at the circuit output OUT by means of output resistor R8 via output cable AL. For a "crossover" of the sensor signal $U_S$ (low-level on the output of comparator K4), the switching transistor T1 is simultaneously blocked so that the voltage signal $U_W=\frac{1}{2}\cdot U_{Smax}$ (i.e. 50% of the positive amplitude of the useful signal in the previous period of the sensor signal $U_S$) is again present on the inverted input (-) of the comparator K4. The next crossover of the sensor signal $U_S$ (transition from positive to negative wave-halves) is thereby first detected by comparator K4 when this voltage value $U_W$ is reached or exceeded during the positive wave-half of the sensor signal $U_S$. In this fashion, interfering signals which are at most half as large as the useful signal of the preceding period of the sensor signal $U_S$ are blocked-out.

The adjustment circuit 24 (diodes D4, D5; switching transistor T2; discharge resistor R11; voltage divider resistors R12, R13) causes a tracking of the maximum value $U_{Smax}$ of the sensor signal $U_S$ stored in the peak value rectifier circuit 21 to the threshold value of the crossover comparator K4 directly after recognition of a response threshold. This guarantees that the threshold value of the crossover comparator K4 is not continuously undershot with constantly weakening useful signals which would otherwise prohibit detection of a crossover. Towards this end, the output of comparator K4 is connected to the base of the switching transistor T2 via the voltage divider R12, R13, the collector of which is connected to the output of the peak value rectifier circuit 21 (capacitor C1) via discharge resistor R11 and diode D5 (or via the capacitor C3 which is parallel thereto) as well as via the diode D4. The transistor T2 is switched during the positive wave-half of the sensor signal $U_S$ and when the threshold value of the comparator K4 is exceeded (high level of the output of the comparator K4). Transistor T2 thereby switches capacitor C3 via the diode D4 which is parallel to capacitor C1 of the peak value rectifier circuit 21. In the event that both capacitors C1, C3 have equal capacitance, the charge stored on capacitor C distributes itself equally onto capacitors C1 and C3 and the voltage $U_{C1}$ on the capacitor C1 sinks to half its value $U_{C1}=\frac{1}{2}\cdot U_{Smax}$. This voltage therefore corresponds to precisely the instantaneous threshold value of the crossover comparator K4. As the positive wave-half of the sensor signal Us continues, both capacitors C1, C3 are charged-up by peak value rectifier circuit 21 to new peak values $U_{Smax}$ of sensor signal $U_S$. After crossover of the sensor signal $U_S$ (low-level of the output of comparator K4), transistor T2 is blocked and the capacitor C3 is discharged via diode D5 and resistor R11 so that the adjustment circuit 24 is ready for the next wave-half. The same potential is present on both leads of diode D5 due to connection between diode D5 and the output of the comparator K3 of the converter circuit 22. In this manner, a discharge of capacitors C1 and C3 directly following charge-up to peak value Usmax of the sensor signal $U_S$ is prevented.

Attenuation stage 30

Overloading (the amplitude of the sensor signal $U_S$ exceeds the maximum input voltage which can be processed by the circuit configuration) is often-caused by the inductive generation of the sensor signal $U_S$ (for example in the event of high signal trigger revolution speeds at low separation between the signal trigger and the inductive sensor). Furthermore, the threshold value of the crossover comparator K4 in the comparator circuit 23 can sometimes be reached by interfering signals to falsely signify a non-present crossover of the sensor signal $U_S$ (i.e. an improper output signal is triggered at the circuit output OUT). In order to preprocess the sensor signal $U_S$ (active attenuation of the sensor signal $U_S$ in dependence on its size), the attenuator stage 30 has an attenuating transistor T3 with emitter resistor R15, voltage divider resistors R14, R16 connected between the base and the emitter of the attenuating transistor T3, and a Zener diode D6 connecting the lead of the voltage divider R14, R16 with the output of the comparator K3 of the converter circuit 22.

Should the voltage $U_{Smax}$ on the output of the converter circuit 22 exceed a value determined by the Zener voltage $U_Z$ of the Zener diode D6 (for example $U_Z$=4.7 V), the transistor T3 is switched and the sensor signal $U_S$ is attenuated by means of the connection between the collector of the transistor T3 and the resistor R2 of the input circuit 11. The selected configuration (resistors R14, R15, R16; diode D6) forms a closed control loop which regulates to an upper limit of $U_{Smax}$ for stabilizing the working point of the transistor T3. Since, with small signal levels, the working point of the transistor T3 is located, by means of appropriate choice of the resistance values of the resistors R2, R14, R15, in the steep section of its output characteristic curve (no differential resistance), interfering signals are more strongly attenuated than the useful signal. In this manner an improvement in the ratio of the useful signal to the interfering signal can be achieved and therefore an increased operational reliability of the circuit configuration in the overloaded operation region.

Error stage 40

The diagnostic circuit 41, having voltage divider resistors R17, R18 and capacitor C4, diagnoses open and short circuits in the sensor cables SL and recognizes faulty inductive sensor installation. Towards this end, the output of the converter circuit 22 is connected to the voltage divider R17, R18. The DC voltage $U_{Smax}$ present at the output of the converter circuit 22 is normalized by means of the voltage divider R17, R18 to the range of 0 V (minimal voltage) to 5 V (maximum voltage). The output signal of the diagnostic circuit 41 is present at the diagnostic output AO of the circuit configuration and introduced for processing, for example, to a D/A converter connected thereto.

In the event of a sensor cable open circuit (broken cable), the entire operating voltage $U_B$ (for example 12 V) is present at the circuit input IN, so that a maximum voltage level of 5 V is present at diagnostic output AO. In the event of a short circuit in sensor cable SL, an operating voltage $U_B$ of 0 V is present at the circuit input IN so that a voltage level of 0 V is present at diagnostic output AO as minimal voltage. Since the amplitude of the useful signal depends, among other things, on the separation between the signal trigger and the inductive sensor, the configuration (installation position) of the inductive sensor can be checked by measurement and evaluation of the amplitude of the sensor signal $U_S$. The voltage dependence, normalized to the region 0 . . . 5 V, is present at the diagnostic output AO and, in the event of an "incorrect" configuration of the inductive sensor (for example, in the event that the inductive sensor becomes detached from its bushing due to vibrations), a rotational speed dependent expectation value is undershot. In all other cases the "correct" voltage $U_O$ of the virtual zero point of, for example, $U_O$=1.9 V is present at the diagnostic output AO.

The polarity switch 42 recognizes an improper inductive sensor polarity (i.e. an exchange of sensor cables SL) and therefore assures that the positive wave-half of the sensor signal $U_S$ precedes the negative wave-half (this must be fulfilled for proper evaluation of the sensor signal). Towards this end, the polarity switch 42 is configured as a Schmitt-trigger-circuit with comparator K5, input resistor R19, feedback resistors R20, R21 and the low-pass, resistor R22 and capacitor C5. A circuit hysteresis is produced by the resistors R19, R20. In consequence of the connection between the non-inverted input (+) of the comparator K5 via the resistor R19 to reference voltage $U_O$ (virtual zero) and of the inverted input (−) of the comparator K5 to the output of the input circuit 11, the output of the comparator K5 is at low-level for passage of the positive wave-half of the sensor signal $U_S$ and, due to the hysteresis, first assumes a high level during the negative wave-half of the sensor signal $U_S$. In dependence on the configuration of the signal trigger (markings) and on the polarity of the inductive sensor, a changing duty cycle is present at the output of the comparator K5 and is integrated via the low-pass, resistor R22 and capacitor C5 to be output as DC voltage signal $U_{AV}$ at the polarity output AV of the circuit configuration. The polarity of the sensor connections or sensor cables SL can be recognized by evaluating this output signal at the polarity output AV. For example, a duty cycle of less than 1:2 (and therefore a DC voltage signal $U_{AV}<\frac{1}{2}\cdot U_B$) indicates a false polarity of the sensor cable, whereas a duty factor of more than 1:2 (DC voltage signal $U_{AV}>\frac{1}{2}\cdot U_B$) indicates a correct sensor cable polarity.

We claim:

1. A circuit configuration for the evaluation of an alternating voltage sensor signal of an inductive sensor in a motor vehicle comprising:

an input stage having an input circuit connected between a voltage source and the inductive sensor for applying a DC voltage to the inductive sensor and having a reference circuit connected to the voltage source for generating an internal reference voltage corresponding to said DC voltage applied to the inductive sensor;

a threshold value stage having a rectifying circuit connected to said input circuit for generating a sensor signal peak value, a converter circuit connected to said rectifying circuit for generating a reduced peak value, a comparator circuit connected to said converter circuit and connected to said input circuit for comparing the sensor signal with said reduced peak value to recognize a crossover of the sensor signal, and an adjustment circuit connected between said comparator circuit and said rectifying circuit for changing said sensor signal peak value following crossover recognition by said comparator circuit; and an error stage having a diagnostic circuit connected to said converter circuit for recognizing defects in a sensor cable and for recognizing defects in the inductive sensor and having a polarity circuit connected to said input circuit and to said reference circuit for recognizing an improper inductive sensor polarity.

2. The circuit configuration of claim 1, further comprising an attenuation stage connected between said input circuit and said converter circuit for active attenuation of the sensor signal at high sensor signal amplitudes.

3. The circuit configuration of claim 1, wherein said input circuit has a first input connected between the voltage source and the inductive sensor and a second input connected between the inductive sensor and ground.

4. The circuit configuration of claim 1, wherein said comparator circuit detects said crossover through voltage comparison of the sensor signal with said reduced peak.

* * * * *